United States Patent
Kamada et al.

(10) Patent No.: US 6,674,086 B2
(45) Date of Patent: *Jan. 6, 2004

(54) ELECTRON BEAM LITHOGRAPHY SYSTEM, ELECTRON BEAM LITHOGRAPHY APPARATUS, AND METHOD OF LITHOGRAPHY

(75) Inventors: Masato Kamada, Hitachinaka (JP); Haruo Yoda, Hinode-machi (JP); Minoru Wakita, Hitachinaka (JP); Hajime Kawano, Hitachinaka (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,181

(22) Filed: Mar. 9, 1999

(65) Prior Publication Data

US 2002/0145119 A1 Oct. 10, 2002

(30) Foreign Application Priority Data

Mar. 20, 1998 (JP) .......................................... 10-071818

(51) Int. Cl.$^7$ .............................................. H01J 37/302
(52) U.S. Cl. .................................................. 250/492.22
(58) Field of Search ........................ 250/492.22, 492.2

(56) References Cited

U.S. PATENT DOCUMENTS

| | | | |
|---|---|---|---|
| 5,083,032 A | * | 1/1992 | Suzuki |
| 5,149,975 A | | 9/1992 | Yoda et al. ............... 250/492.2 |
| 5,278,421 A | | 1/1994 | Yoda et al. ............. 250/492.22 |
| 5,933,212 A | * | 8/1999 | Kasuga |
| 5,955,738 A | * | 9/1999 | Mannabe et al. ...... 250/492.22 |
| 5,973,333 A | * | 10/1999 | Nakasuji et al. |
| 6,008,498 A | * | 12/1999 | Simizu |
| 6,104,035 A | * | 8/2000 | Muraki |
| 6,121,625 A | * | 9/2000 | Ito et al. |
| 6,124,599 A | * | 9/2000 | Muraki |
| 6,140,654 A | * | 10/2000 | Nakasugi et al. |
| 6,145,118 A | * | 11/2000 | Tomita |
| 6,166,387 A | * | 12/2000 | Muraki et al. |

* cited by examiner

Primary Examiner—Kiet T. Nguyen
(74) Attorney, Agent, or Firm—Kenyon & Kenyon (57) ABSTRACT

The subject that should be solved in the present invention is to improve throuput of electron beam lithography apparatus or electron beam lithography system and lithography method used therefor. The electron beam lithography apparatus by the present invention comprises a lithography data generation part, an exposure map implementation part, and plurality of lithography data generation parts, thereby several exposure maps which are different in condition and type, are implemented in parallel. Moreover, the electron beam lithography apparatus by present invention has a construction to compare outputs from the lithography data generation parts. Moreover, the electron beam lithography system by present invention has a construction to use lithography data formed with the lithography data generation parts of one of the electron beam lithography apparatuses with other of the electron beam lithography apparatuses.

10 Claims, 8 Drawing Sheets

"PRIOR ART"

ELECTRON BEAM LITHOGRAPHY SYSTEM, ELECTRON BEAM LITHOGRAPHY APPARATUS, AND METHOD OF LITHOGRAPHY

BACKGROUND OF THE INVENTION

Present invention relates to an electron beam lithography apparatus which an electron beam is irradiated to a sample so as to produce a desired lithography pattern on a sample, an electron beam lithography system thereof and an electron beam lithography method used therein.

Figure 10:
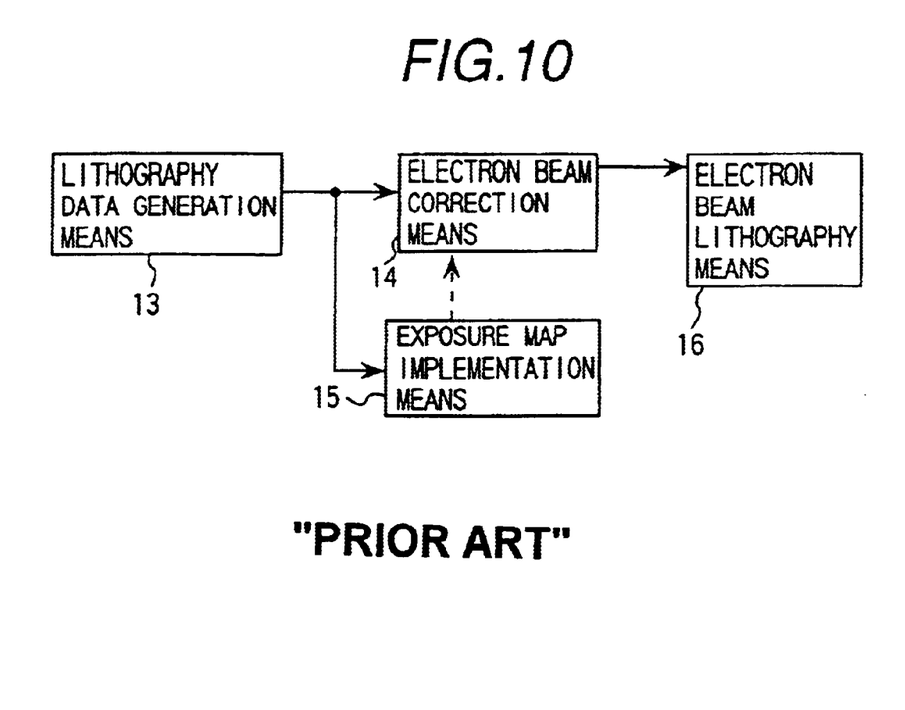
FIG. 10 is a block diagram showing a function of the electron beam lithography apparatus in the prior art.

A functional block diagram of a lithography data generation part in a conventional electron beam lithography apparatus is shown in FIG. 10.

In the conventional electron beam lithography apparatus, the lithography data corresponding to an irradiation unit (coordinates, size, irradiation quantity) generated by an electron beam lithography data generation means 13 are revised by a predetermined electron beam correction means 14, and the electron beam that is designated by the revised lithography data is irradiated to an exposure agent applied on the sample by the electron beam lithography means 16.

There are various kinds of methods to correct the electron beam by the electron beam correction means 14, and a proximity effect correction is applied to them here.

This proximity effect means a phenomenon that a part of an exposure agent having a high ratio of irradiation quantity to an area irradiated with the electron beam, is exposed in excess, because the electron beam that is irradiated on the sample, passes through the layer of the exposure agent on a surface of the sample, and the electron beam scattered at an interior part of the sample passes through the exposure agent of the sample surface again.

In U.S. Pat. No. 5,149,975 and U.S. Pat. No. 5,278,421 corresponding to a Japanese Patent Laid-open No. 3-225816 (1991) bulletin relating to the electron beam lithography apparatus, a lithography technique is indicated, whereby an exposure map is obtained in a storage device based on an exposure area density of the pattern to be formed on the sample top without irradiating an electron beam before an actual lithography is done, and the irradiation quantity of the electron beam is corrected to become small relatively in a place where the exposure area density is high, and to become large relatively in a place where the exposure area density is low by an exposure map implementation means 15 shown in FIG. 10 in a real lithography referring to the storage device.

In the prior art mentioned above, in order to perform the most suitable lithography, whenever conditions of mesh size to divide the exposure pattern and number of times to filter are changed, the exposure map is reformed, and an empty lithography operation is performed according to it without irradiating the electron beam so as to be evaluated. Therefore, in order to expose with the lithography data of one pattern ideally, several times of the exposure map implementation and the empty lithography operation becomes necessary.

In the prior art furthermore, as the exposure map is reformed whenever the condition changes, the exposure map before reformed cannot be held. Therefore in order to perform the most suitable lithography again, the same lithography data should be reformed again.

These let throughputs of the electron beam lithography apparatus deteriorate.

In the electron beam lithography apparatus of a mask especially, only one piece of the mask can be exposed for one lithography data and one lithography data cannot be used repeatedly, and there arise a problem that the throughput is deteriorated.

SUMMARY OF THE INVENTION

The present invention is provided referring to the problems of such a prior art, and is expected to offer an electron beam lithography apparatus, an electron beam lithography system and a lithography method used therefor to let the throughput improve.

In order to solve the above problem, the electron beam lithography apparatus in the present invention comprises, a lithography data generation means for generating lithography data to form an exposure pattern on the sample, an exposure map implementation means for making exposure map of an electron beam from the lithography data, plurality of lithography data generation parts comprising a electron beam correction means for revising an irradiation quantity of the electron beam irradiated to the sample by referring to the exposure map, and electron beam lithography means to expose by irradiating the electron beam to the sample based on a value revised with the electron beam correction means.

As plurality of the lithography data generation parts are provided and plural exposure maps based on different conditions and different types can be formed in parallel, the most suitable lithography condition can be analyzed quickly and the above object can be achieved.

As an example of generation condition of the lithography data, mesh size at the time of the exposure map implementation and number of times of smoothing the area density performed between the adjacent meshes are raised.

Moreover, the electron beam lithography apparatus having an output comparing means for comparing an output from the plural several lithography data generation means, can check malfunction of the total control circuit by comparing the output obtained by letting the lithography data generation part operated in the same operation, thereby reliability of the electron beam lithography apparatus can be increased.

Furthermore, the electron beam lithography apparatus has a function to form the exposure map of the second lithography data in parallel during the exposure of the first lithography data.

The electron beam lithography apparatus further has a function to divide and form the exposure map to be exposed with the plural lithography data generation part.

Based on these functions, the implementation of the exposure map is performed in parallel with the plural lithography data generation parts relating to a big exposure pattern which the exposure map to be exposed exceeds a range that can be formed with one lithography data generation part, thereby degradation of the throughput can be prevented.

Moreover, two electron beam lithography apparatus are connected with a data transmission means, and the lithography data formed with the first electron beam lithography apparatus is transmitted to the second electron beam lithography apparatus, thereby the second electron beam lithography apparatus may perform the lithography using the same lithography data in the same way as the first electron beam lithography apparatus.

Moreover, if the electron beam lithography apparatus in the present invention is used for a pattern lithography to a mask, reticle used for an exposure apparatus, the lithography data made once is used repeatedly to expose, and throughput thereof is improved.

DETAILED DESCRIPTION OF THE PREFERRED EMBODIMENTS

Referring to the figures, embodiments of the present invention will be explained as follows.

In the beginning, a construction of an example of an electron beam lithography apparatus in the present invention will be explained using FIG. 1.

Figure 1:
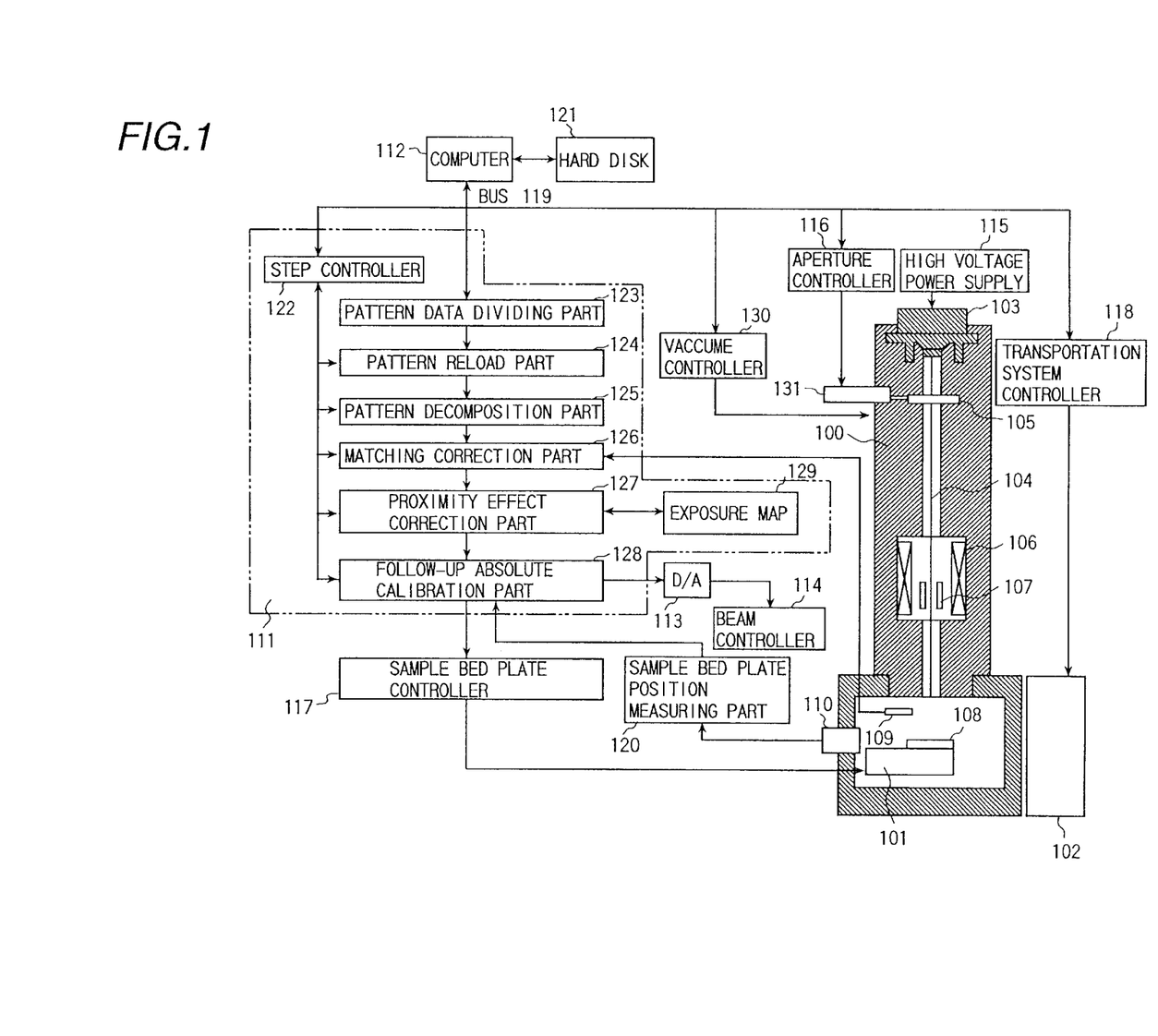
FIG. 1 is a sectional view showing an example of an electron beam lithography apparatus in the present invention.

In FIG. 1, a part which is shown on the right hand side with hatching, is an electron beam generating equipment body 100 to expose a wafer.

A sample 108 is transferred from a transportation part 102 to a sample bed plate 101 inside of the electron beam generating equipment body 100.

An electron beam 104 that is emitted from an electron gun 103 provided on a top of the electron beam generating equipment body 100 is adjusted its configuration by an optical lens 106 provided in the equipment body 100, and is deflected furthermore by a deflection device 107 constructed with an electromagnetic deflection device and an electrostatic deflection device, and is irradiated on an objective position of the sample 108 disposed on the sample bed plate 101.

Plurality of cross-sections of the irradiated electron beam 104 are capable to be copied on the sample 108 by selecting an aperture 105.

A part of light-hand side of FIG. 1 shows function of the control system with plural blocks, and controls total of the system and has a function as an interface with an external device.

A computer 112 transmits the lithography data of the patterns that should be exposed and stored in a hard disk 121.

Black boxes surrounded by a two dotted line 111 are a control system digital processing group which converts the lithography data transmitted from the computer 112 into deflection data for the electron beam continuously with a high-speed, and are connected to other controller through a bus 119, and they are processed as follows.

(1) Pattern data dividing part 123:
Compressed lithography data transmitted from the computer 112 are stored.

(2) Pattern reload part 124:
The compressed lithography data are re-constructed to the pattern data.

(3) Pattern decomposition part 125:
Each figure being re-constructed is replaced to a shot as a configuration that can be exposed by the electron beam, and data of position, configuration, and exposure amount of each shot are provided.

(4) Matching correction part 126:
By watching position difference and deformation between the electron beam irradiation position and the sample 108 with a sensor 109, they are revised according to the position difference and the deformation.

(5) Proximity effect correction part 127:
A processing to revise the proximity effect is performed. the exposure map 129 of an exposure quantity to a unit area of the pattern to be exposed is previously obtained, and is stored in a storage device, and the exposure quantity is revised in a shot unit referring to the value of the exposure map.

(6) Follow-up absolute calibration part 128:
In order to obtain a continuous writing, the electron beam deflection position is calculated based on a position of the sample bed plate 101 measured with a length measuring machine 110 and a sample bed plate position measuring part 120 so that the electron beam 104 is to be irradiated to the objective position on the sample 108, and quantities of the deflection distortion of the electron beam generating equipment body 100 are revised too.

(7) Step controller 122:
In order to operate the processing in the above each unit smoothly, monitoring and controlling are performed. Data from the unit in the above-mentioned frame 111 are performed a D-A conversion with a digital-to-analog converter 113, and are transferred to the beam controller 114 so as to control the optical lens 106 and the deflection device 107.

Furthermore, a high voltage power supply 115 occurs an accelerating voltage of the electron gun 103, an aperture controller 116 controls an aperture replacement part 131 so as to select configurations of an aperture 105, a sample bed plate controller 117 controls movement of the sample bed plate 101, and a transportation system controller 118 controls a transportation part 102 which transports the sample 108 to the sample bed plate 101.

Each units are connected with a bus 119, and the signals are transferred through an interface.

These unit can be controlled by the computer 112 too. The first embodiment of the present invention is shown by FIGS. 2 to 7.

Figure 2:
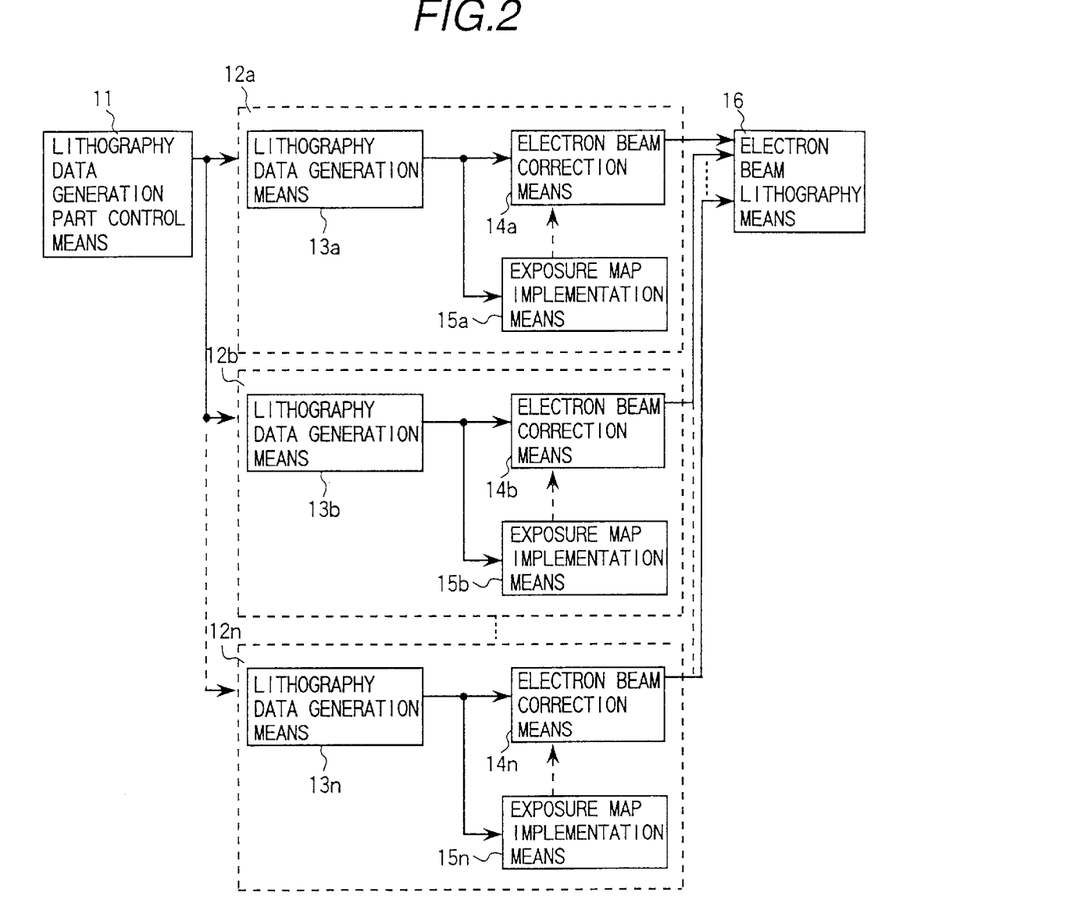
FIG. 2 is a block diagram showing function of proximity effect correction part shown in FIG. 1.

FIG. 2 is a block diagram showing a function of a proximity effect correction part 127 shown in FIG. 1.

This electron beam lithography apparatus has plurality of lithography data generation part 12a, 12b, . . . , 12n controlled by a lithography data generation part control means 11 and an electron beam lithography means 16.

Each respective lithography data generation parts 12a, 12b, . . . , 12n respectively has lithography data generation means 13a, 13b, . . . , 13n, electron beam correction means 14a, 14b, . . . , 14n, and exposure map implementation means 15a, 15b, . . . , 15n. The lithography data generation part control means 11 indicates a condition of the lithography data to the plural lithography data generation parts 12a, 12b, , 12n, or outputs a select indication of the data to be output from the lithography data generation part to the electron beam lithography means 16

Figure 3:
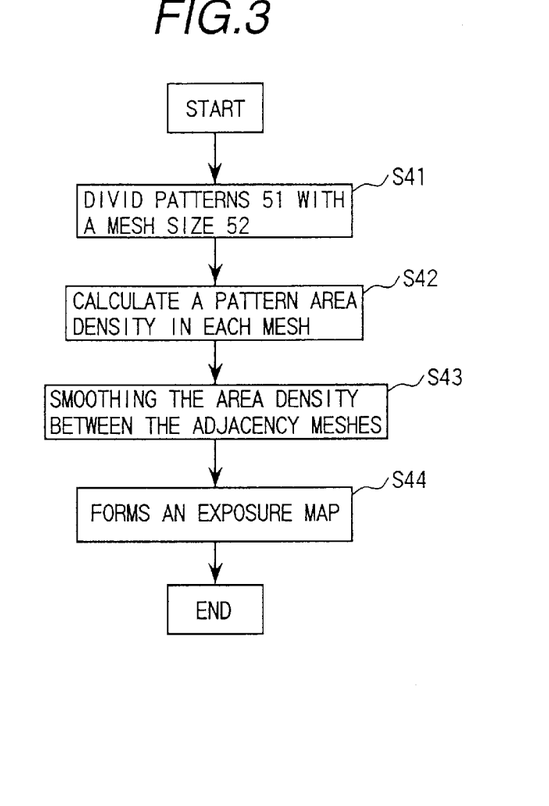
FIG. 3 is a flow chart showing steps for an exposure map implementation.
Figure 4:
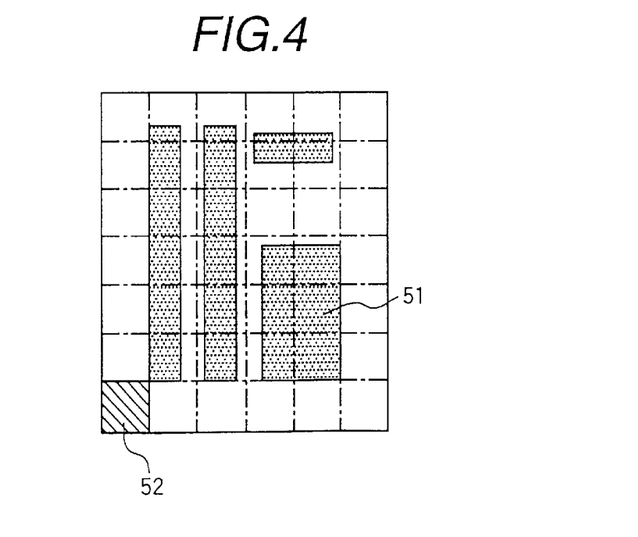
FIG. 4 is an illustration to show an example of a configuration of a pattern.

A flow chart which shows steps for implementing the exposure map is shown in FIG. 3 and an example of pattern configuration is shown in FIG. 4.

In step S41 of FIG. 3, patterns 51 shown in FIG. 4 are divided with a mesh size 52, and pattern area density in each mesh is obtained in step S42.

In the next in step S43, smoothing for reducing dimensional change at a part where the area density changes greatly between the adjacency meshes, is performed, and an exposure map is formed in step S44.

In case of implementation of the exposure map, electron beam data (for example, coordinates, size, irradiation quantity) from the lithography data generation means 13 are transferred to the exposure map implementation means 15.

Figure 5:
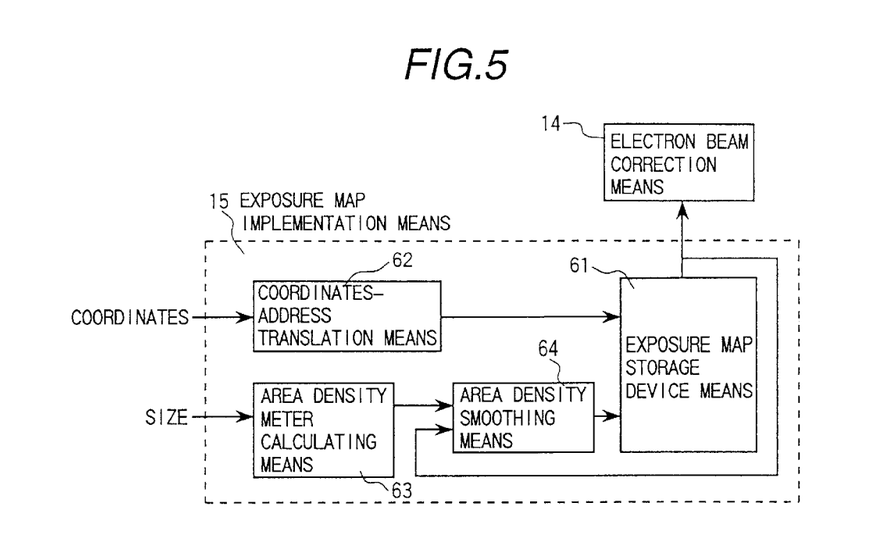
FIG. 5 is a block diagram showing an exposure map implementation means further in detail.

FIG. 5 is a block diagram which shows the exposure map implementation means 15 further in detail.

In the exposure map implementation means 15, in order to make and store the exposure map obtained from the lithography data that the lithography data generation means 13 shown in FIG. 2 has generated, on an exposure map storage device 61, coordinates—address translation means 62 to generate a corresponding address from the coordinate data, and an area density meter calculating means 63 to generate an area density from data to show a size of the pattern are obtained, the value obtained as the above is smoothed by the area density smoothing means 64, and the smoothed value is accumulated by the exposure map storage device 61 so as to be stored.

Moreover when the value stored in the exposure map storage device 61 is smoothed again, the value is read out from the exposure map storage device 61, and is smoothed with the area density smoothing means 64 and is stored in the exposure map storage device 61.

When exposing, the electron beam correction means 14 revises an irradiation quantity data among the lithography data input from the lithography data generation means 13 by value of the address corresponding to the exposure map generated previously.

That is, the value that corresponding lithography data and several values close thereto are read out from the value of the exposure map storage device 61 which is generated by the exposure map implementation means 15, and calculate a density degree in a peripheral of the lithography data from them, and the irradiation quantity is adjusted in inversely proportional to it.

The electron beam lithography means 16 outputs irradiation quantity, coordinates and size of the electron beam revised by the electron beam correction means 14 to an electron gun and lithography correction is performed.

In the next in FIG. 2, the lithography data generation part control means 11 outputs different dividing mesh sizes and condition of smoothing number of times, respectively to each lithography data generation part 12a, 12b, . . . , 12n. In each lithography data generation part 12a, 12b, . . . , 12n, the area densities are calculated according to every mesh sizes by an area density calculating means 63 shown in FIG. 5 in each of the exposure map implementation means 15a, 15b, . . . , 15n on the basis of the lithography data generated by each lithography data generation means 13a, 13b, . . . , 13n, and the calculated value is corresponded to the storage device address which is output from the coordinates—address translation means 62 and is stored in the exposure map storage device 61.

By processing in this way, plurality of the exposure maps having different conditions becomes possible to be formed within a clock time same as the exposure map implementation time as before.

When one of the lithography data generation parts 12a, 12b, . . . 12n is selected by the lithography data generation part control means 11, and the lithography data is output from the lithography data generation means 13 in the selected lithography data generation part 12n in the next.

In the same way as the exposure map generation stated the above, the address corresponding to the exposure map storage device 61 show in FIG. 4 is output from the coordinates—address translation means 62, and the corresponding value and the value close thereto are read.

In electron beam correction means 14, referring to the value having been read, the irradiation quantity is revised so as to make the irradiation quantity relatively small in the place where the exposure density is high and to make the irradiation quantity relatively large on the contrary in the place where the exposure density is low.

The electron beam lithography means 16 parformes lithography correction by receiving the lithography data revised by the electron beam correction means 14.

This operation is continuously performed relating to all lithography data of the lithography data generation part 12a, 12b, . . . , 12n, and the lithography results are evaluated, thereby the lithography work becomes possible to be done again on the basis of the most suitable evaluated lithography data.

Figure 6:
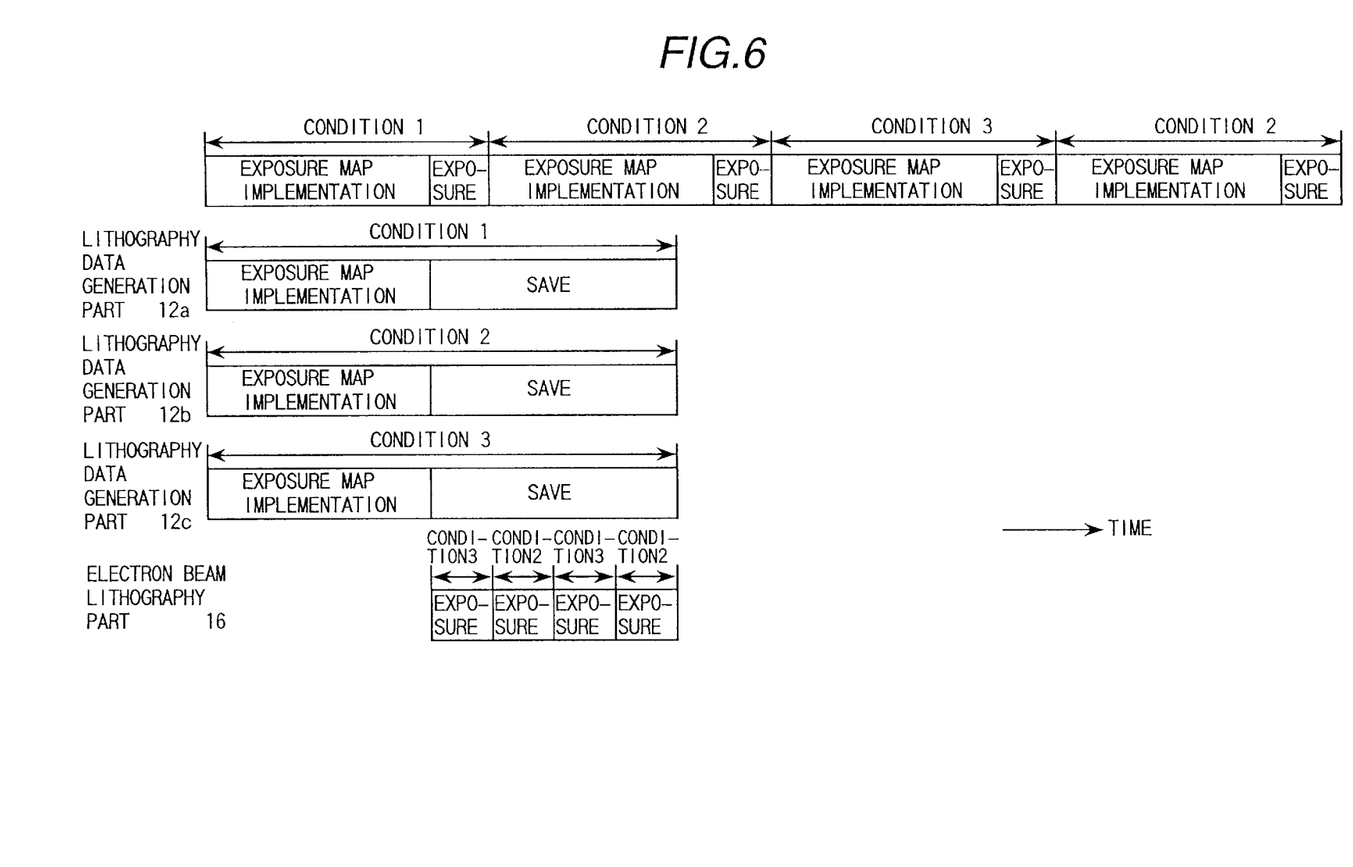
FIG. 6 is a time chart to show an exposure map implementation clock time, and a lithography time.

FIG. 6 is a time chart to show size of the exposure map implementation time and the lithography time, and the first embodiment of the present invention is shown by comparing with a case of the prior art.

In FIG. 6, the lithography data under the different three conditions (condition 1, condition 2 and condition 3) are evaluated, and time rates in a case exposed with the evaluated suitable data (lithography data of condition 2 in the case of FIG. 6) are compared.

In a case of the prior art, the exposure map is made under the condition 1, an empty lithography is performed based on the exposure map, the exposure map is formed under the condition 2 next so as to perform the empty lithography, and after that the exposure map is formed under the condition 3 so as to perform empty lithography.

Then, results of the empty lithographyes by the every conditions are evaluated, and if it becomes clear that the condition 2 is the most suitable, the exposure map is formed again and a real lithography is performed under the condition 2.

On the other hand, in the first embodiment of the present invention, the exposure maps under the different conditions are formed simultaneously.

That is, the exposure map under the condition 1 is formed by the lithography data generation part 12a, the exposure map under the condition 2 is formed by the lithography data generation part 12b, and the exposure map under the condition 3 is formed by the lithography data generation part 12c, respectively in parallel.

The formed exposure maps are stored in each lithography data generation part.

In the electron beam lithography means 16, the lithography under the condition 1, condition 2, and condition 3 are performed successively based on the exposure maps stored in the each lithography data generation part 12a, 12b, 12c.

If it becomes clear that the condition 2 is the most suitable as a result of having evaluated the lithography results, the lithography under the condition 2 can performed promptly using the exposure map stored in the lithography data generation part 12b.

Therefore, the throughput of the lithography can be improved largely comparing with that in the prior art. FIG.

Figure 7:
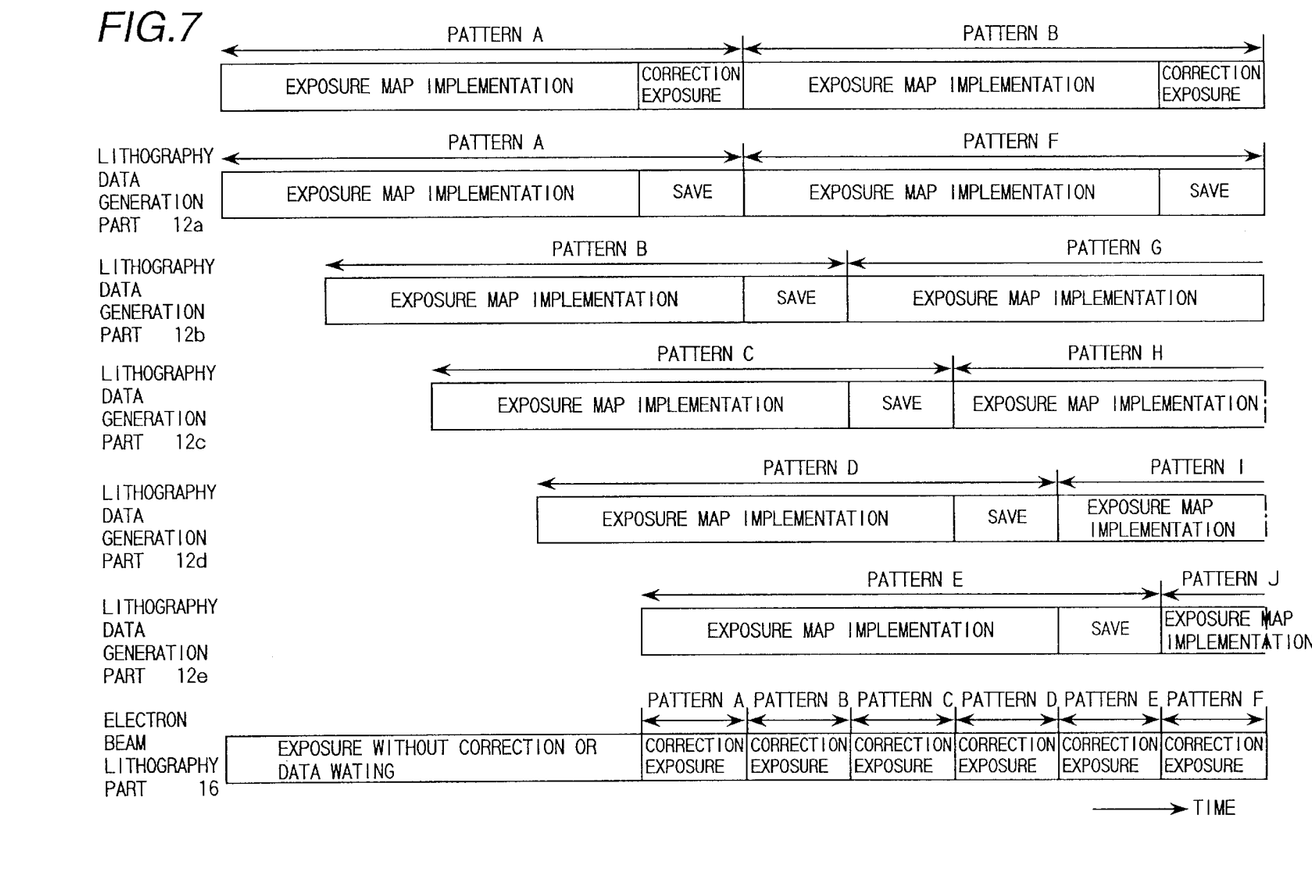
FIG. 7 is other time chart to show an exposure map implementation clock time and a lithography time.

7 is other embodiment of the time chart shown in FIG. 6. In the plural lithography data generation parts 12a, 12b, . . . , 12n shown in FIG. 2, this example shows lithography data to expose different patterns.

As shown in FIG. 7, the lithography data generation part control means 11 shown in FIG. 2, indicates to the five lithography data generation parts 12a, 12b, 12c, 12d, 12e so as to form different lithography data with each of the lithography data generation means 13.

In the five lithography data generation parts 12a, 12b, 12c, 12d, 12e, the exposure maps are formed based on the lithography data output from the each lithography data generation means 13.

As a result, as shown in the figures, it become possible in the present invention to expose six patterns A, B, C, D, E, F within the same hours as that spent for a lithography of two patterns A, B in the prior art.

While the patterns A to F exposes so as to be corrected as exposure maps of patterns G to J can be formed in the lithography data generation part 12b to 12e furthermore, After finishing the correction lithography of the pattern F, the correction lithography of the pattern G becomes possible successively.

As stated above, plural exposure maps of different types becomes possible to be formed with the same times as the implementation times of one exposure map in the prior art.

Therefore, the electron beam lithography to be performed in the next, becomes possible to be performed successively in spite of the different lithography data in exposure map unit.

Furthermore, while performing the electron beam lithography, in the lithography data generation part which is not used, it becomes possible to perform the implementation of the exposure map using new lithography data in parallel, throughput of the lithography is improved largely.

Moreover, in the electron beam lithography apparatus shown in FIG. 2, exposure map exceeding a range that can be formed with the lithography data generation part in one system, can be formed easily, too.

That is, when exceeding the range that the exposure map as the lithography object can be formed with the lithography data generation part of the one system, the exposure map implementation is performed by dividing the total exposure map with the exposure map unit that can be processed with the lithography data generation part of the one system.

At first, the lithography data generation part control means 11 orders how to divide the total exposure map, the exposure maps are formed respectively in a divided unit with each of the lithography data generation parts 12a, 12b, . . . , 12n.

Referring to the exposure map formed with the lithography data generation part 12a in the next, the electron beam lithography means 16 performs to expose, successively referring to the exposure map formed with the lithography data generation part 12b, the electron beam lithography means 16 performs to expose in the same way, and as each of the lithography data generation parts 12a to 12n are controlled with the lithography data generation part control means 11, the exposure map of all sizes become possible to be exposed.

Figure 8:
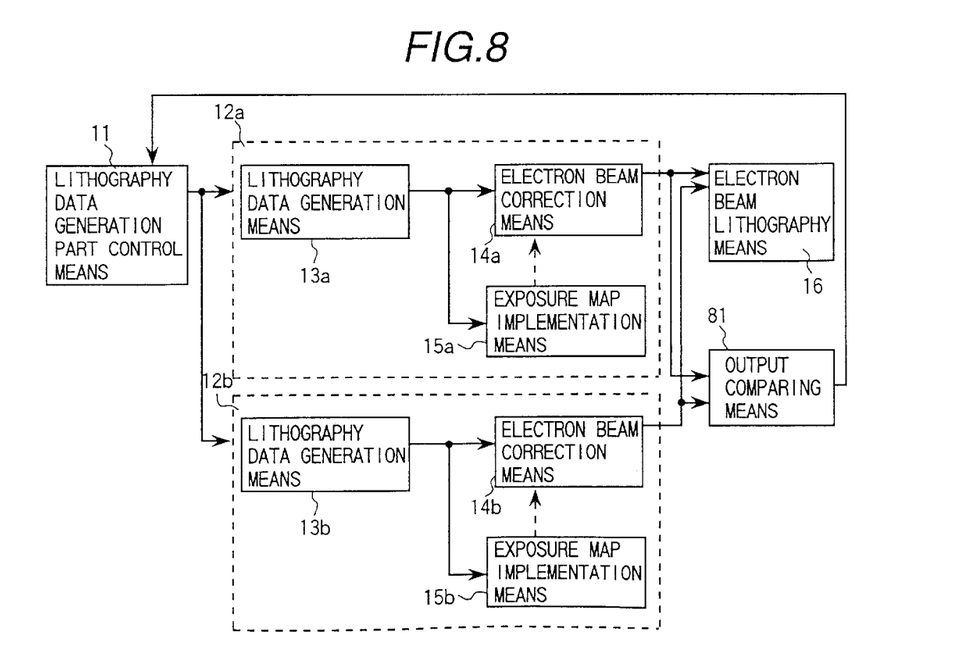
FIG. 8 is a block diagram showing a function of the proximity effect correction part shown in FIG. 1.

FIG. 8 shows the second embodiment by the present invention and is a block diagram corresponding to FIG. 2.

It is a characteristic that this embodiment comprises two lithography data generation parts 12a, 12b and an output comparing means 81.

The output comparing means 81 compares the output of the electron beam correction means 14a in the lithography data generation part 12a with the output of the electron beam correction means 14b in the lithography data generation part 12b.

In FIG. 8, the lithography data generation part control means 11 orders the same operation to two systems of the lithography data generation part 12a and the lithography data generation part 12b at first, and the outputs therefrom are compared with the output comparing means 81.

When the output of the electron beam correction means 14b did not accord with the output of the electron beam correction means 14a, the information relating to the comparing is transmitted to the lithography data generation part controller 11, the lithography data generation part control means 11 orders to start each lithography data generation parts 12a, 12b again, and the outputs of them are compared with the output comparing means 81.

If the outputs of them accord each other as a result of the comparing, it is judged as being normal, and the exposing is performed, thereby, the lithography failure can be prevented beforehand and reliability of the apparatus and system is improved largely.

Figure 9:
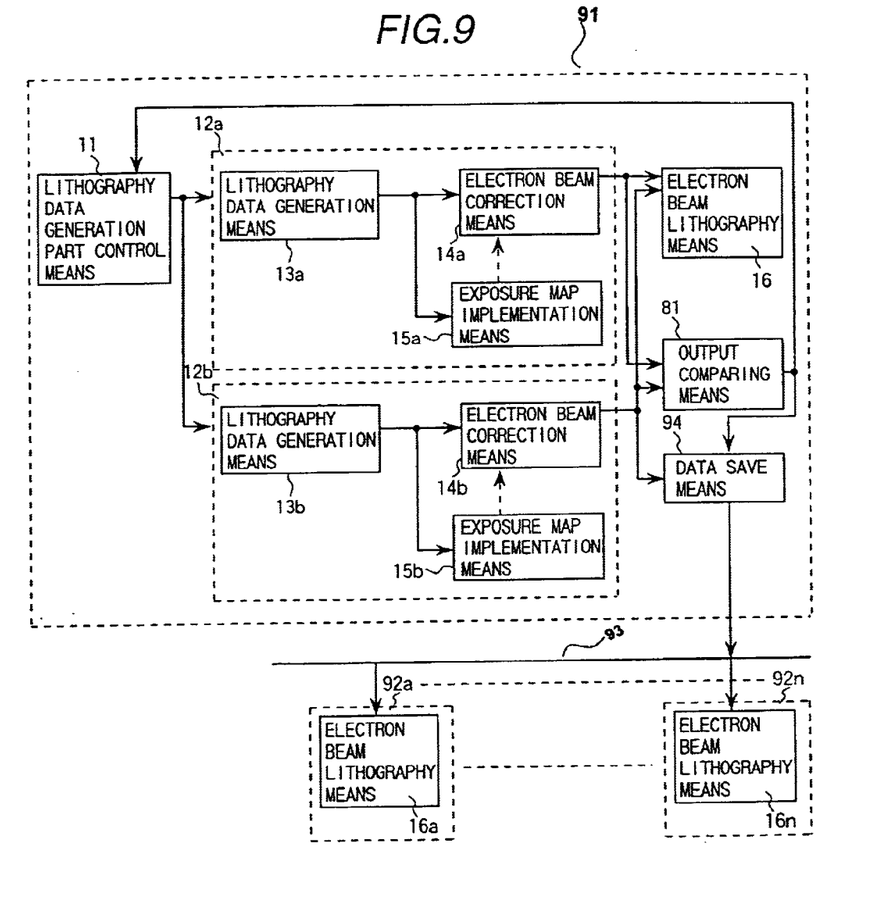
FIG. 9 is other block diagram showing other function of the proximity effect correction part shown in FIG. 1.

FIG. 9 shows the third embodiment by the present invention and is a block diagram corresponding to FIG. 2.

In this embodiment, first electron beam lithography apparatus 91 having a construction same as that shown in FIG. 8, and second electron beam lithography apparatus 92a installing only electron beam lithography means 16a referring to the construction shown in FIG. 8 and other electron beam lithography apparatus 92n installing only electron beam lithography means 16n in the same way are combined through a communications means 93.

In the first electron beam lithography apparatus 91, in a case that a result by comparing the output from the output comparing means 81 is normal, a data save means 94 saves the output from the lithography data generation part 12a or the lithography data generation part 12b.

In the electron beam lithography apparatus 91, the lithography data generation part control means 11 orders to make two systems of the lithography data generation part 12a and the lithography data generation part 12b do the same operation, and the outputs of the both parts are compared by the output comparing means 81.

In a case that a result by comparing the output from the output comparing means 81 is normal, the lithography data generation part control means 11 indicates the lithography data generation part 12a to expose, and indicates the lithography data generation part 12b to transmit the output into the data save means 94 simultaneously.

The output of the electron beam lithography data generation part 12b is saved in the data save means 94.

This saved data is transmitted to the second electron beam lithography apparatus 92a or the electron beam lithography apparatus 92n through a communications means 93, thereby the lithography processing which is performed in the same way as the first electron beam lithography apparatus performed by the plural electron beam lithography apparatuses becomes possible.

As stated above according to the present invention, the evaluation of the most suitable lithography data can be performed quickly, and the throughput is improved.

Moreover, as the data of the exposure map can be saved, and the work to forms the same data in a case exposing again can be omitted, it become possible to improve the throughput largely furthermore.

Moreover, reliability of the apparatus and the system are possible to be improved.

What is claimed is:

1. An electron beam lithography apparatus comprising:
a plurality of lithography data generation parts, respectively forming a plurality of exposure maps having different exposure conditions and generating lithography data to form an exposure pattern for a sample, said lithography data generation parts each having:
   an exposure map implementation part to form an exposure map for an electron beam from said lithography data,
   an electron beam correction part for correcting an irradiation quantity of said electron beam to be irradiated to said sample referring to said exposure map, and
   an electron beam lithography part for performing exposure by irradiating said electron beam onto the sample based on a value corrected by said electron beam correction part, wherein
   said lithography data generation parts simultaneously and respectively form said exposure maps respectively having different exposure conditions based on an order that orders a plurality of different operations based on one of the plurality of lithography data to plural lithography data generating parts, and
   said electron beam lithography part irradiate said electron beam based on one of said exposure maps corrected by said electron beam correction parts.

2. An electron beam lithography apparatus as defined in claim 1, wherein
said plurality of lithography data generation parts form plurality of lithography data having a different condition to be generated in parallel.

3. An electron beam lithography apparatus as defined in claim 1, comprising
an output comparing part for comparing outputs from said several lithography data generation parts.

4. An electron beam lithography apparatus as defined in claim 1, wherein
an exposure map implementation of a second pattern is performed in parallel based on said lithography data from a second lithography data generation part in plurality of said lithography data generation parts, while a first pattern is exposed based on said lithography data from a first lithography data generation part in plurality of said lithography data generation parts.

5. An electron beam lithography apparatus as defined in claim 1 wherein,
said exposure map is divided by said plurality of lithography data generation part.

6. An electron beam lithography apparatus as defined in claim 1, wherein
said sample is at least one of a wafer, a mask, and a reticle.

7. An electron beam lithography apparatus, comprising a first electron beam lithography apparatus and a second electron beam lithography apparatus connected to a data transmission part, wherein
said first electron beam lithography apparatus forms a plurality of sets of lithography data based on an order that orders a plurality of different operations based on one of the plurality of lithography data to plural lithography data generating parts, and
said second electron beam lithography apparatus exposes a sample based on lithography data formed by said first electron beam lithography apparatus.

8. An electron beam lithography apparatus as defined in claim 7, wherein
said first electron beam lithography apparatus comprises plurality of lithography data generation parts having a lithography data generation part for forming said lithography data, an exposure map implementation part for forming exposure maps of an electron beam using said lithography data, and an electron beam correction part for correcting an irradiation quantity of the electron beam to be irradiated to the sample referring to said exposure map, and
said second electron beam lithography apparatus comprises an electron beam lithography part for exposing said sample by irradiating said electron beam on said sample based on a value corrected by said electron beam correction part of the first electron beam lithography apparatus.

9. A lithography method comprising the steps of:
forming plurality of sets of lithography data to form an exposure pattern on a sample,
forming respective exposure maps having different exposure conditions from said plurality of sets of lithography data,
correcting an irradiation quantity of an electron beam to be irradiated on said sample by referring to said exposure maps,
simultaneously and respectively forming said exposure maps respectively having different exposure conditions based on a order that orders a plurality of different operations based on one of the plural lithography data for forming plural sets of lithography data, and
irradiating said sample with said electron beam on the basis of one of said exposure maps with said irradiation quantity corrected.

10. A lithography method comprising the steps of
forming a first electron beam lithography apparatus for forming a plurality of sets of lithography data based on a order that orders a plurality of different operations based on one of the plural lithography data for forming plural sets of lithography data, and
irradiating an electron beam on a sample using a second electron beam lithography apparatus based on one of said sets of lithography data formed by said first electron beam lithography apparatus.

* * * * *

UNITED STATES PATENT AND TRADEMARK OFFICE
CERTIFICATE OF CORRECTION

| | |
|---|---|
| PATENT NO. | : 6,674,086 B2 |
| APPLICATION NO. | : 09/265181 |
| DATED | : January 6, 2004 |
| INVENTOR(S) | : Kamada et al. |

It is certified that error appears in the above-identified patent and that said Letters Patent is hereby corrected as shown below:

Columns 1 through 8, kindly delete in their entirety and replace with the attached substitute specification columns 1 through 10 attached.

Signed and Sealed this

Thirteenth Day of March, 2007

JON W. DUDAS
*Director of the United States Patent and Trademark Office*

ELECTRON BEAM LITHOGRAPHY SYSTEM, ELECTRON BEAM LITHOGRAPHY APPARATUS, AND METHOD OF LITHOGRAPHY

BACKGROUND OF THE INVENTION

The present invention relates to an electron beam lithography apparatus in which an electron beam is irradiated onto a sample so as to produce a desired lithography pattern on the sample, an electron beam lithography system therefor and an electron beam lithography method used therein.

A functional block diagram of a lithography data generation part in a conventional electron beam lithography apparatus is shown in FIG. 10.

In the conventional electron beam lithography apparatus, the lithography data corresponding to an irradiation unit (coordinates, size, irradiation quantity) generated by an electron beam lithography data generation means 13 are revised by a predetermined electron beam correction means 14, and the electron beam that is designated by the revised lithography data is irradiated onto an exposure agent applied on the sample by the electron beam lithography means 16.

There are various kinds of methods to correct the electron beam with the electron beam correction means 14, and a proximity effect correction is applied to them here.

This proximity effect means a phenomenon in which a part of an exposure agent having a high ratio of irradiation quantity to an area irradiated with the electron beam, is exposed in excess, because the electron beam that is irradiated on the sample, passes through the layer of the exposure agent on a surface of the sample, and the electron beam scattered at an interior part of the sample passes through the exposure agent of the sample surface again.

In U.S. Pat. No 5,149,975 and U.S. Pat. No 5,278,421 corresponding to a Japanese Patent Laid-open 3-225816 (1991) bulletin relating to the electron beam lithography apparatus, a lithography technique is indicated, whereby an exposure map is obtained in a storage device based on an exposure area density of the pattern to be formed on the sample top without irradiating an electron beam before an actual lithography is done, and the irradiation quantity of the electron beam is corrected to become small relatively in a place where the exposure area density is high, and to become large relatively in a place where the exposure area density is low by an exposure map implementation means 15 shown in FIG. 10 in a real lithography referring to the storage device.

In the prior art mentioned above, in order to perform the most suitable lithography, whenever conditions of mesh size to divide the exposure pattern and number of times to filter are changed, the exposure map is reformed, and an empty lithography operation is performed according to it without irradiating the electron beam in order to do an evaluation. Therefore, in order to expose with the lithography data of one pattern ideally, several repetitions of the exposure map implementation and the empty lithography operation becomes necessary.

In the prior art furthermore, since the exposure map is reformed whenever the conditions change, the exposure map existing before being reformed cannot be held.

Therefore, in order to perform the most suitable lithography again, the same lithography data must be reformed again.

These requirements cause the throughputs of the electron beam lithography apparatus to deteriorate.

In electron beam lithography apparatus for a mask especially, only one piece of the mask can be exposed for one set of lithography data and one set of lithography data cannot be used repeatedly. As a result, a problem regarding deterioration of the throughput arises.

SUMMARY OF THE INVENTION

The present invention is provided referring to the problems of such a prior art, and is expected to offer an electron beam lithography apparatus, an electron beam lithography system and a lithography method used therefor to let the throughput improve.

In order to solve the above problem, the electron beam lithography apparatus in the present invention comprises: a lithography data generation means for generating lithography data to form an exposure pattern on the sample; an exposure map implementation means for making an exposure map of an electron beam from the lithography data; a plurality of lithography data generation parts, each comprising an electron beam correction means for revising an irradiation quantity of the electron beam irradiated onto the sample by referring to the exposure map; and electron beam lithography means to expose by irradiating the electron beam onto the sample based on a value revised with the electron beam correction means.

Since a plurality of the lithography data generation parts are provided and plural exposure maps based on different conditions and different types can be formed in parallel, the most suitable lithography condition can be analyzed quickly and the above object can be achieved.

As an example of a generation condition of the lithography data, mesh size at the time of the exposure map implementation and number of times of smoothing the area density performed between the adjacent meshes are considered.

Moreover, the electron beam lithography apparatus having an output comparing means for comparing an output from the plural several lithography data generation means, can check a malfunction of the total control circuit by comparing the output obtained by letting different lithography data generation parts be operated in the same operation. Thereby, reliability of the electron beam lithography apparatus can be increased.

Furthermore, the electron beam lithography apparatus has the function of forming the exposure map of the second lithography data in parallel during the exposure of the first lithography data.

The electron beam lithography apparatus further has the function of dividing and forming the exposure map to be exposed with the plural lithography data generation parts.

Based on these functions, the implementation of the exposure map is performed in parallel with the plural lithography data generation parts relating to a big exposure pattern which the exposure map to be exposed exceeds a range that can be formed with one lithography data generation part. Thereby degradation of the throughput can be prevented.

Moreover, two electron beam lithography apparatuses are connected with a data transmission means, and the lithography data formed with the first electron beam lithography apparatus is transmitted to the second electron beam lithography apparatus. Thereby the second electron beam lithography apparatus may perform the lithography using the same lithography data in the same way as the first electron beam lithography apparatus.

Moreover, if the electron beam lithography apparatus in the present invention is used for a pattern lithography to a mask, a reticle used for an exposure apparatus, the lithography data made once is used repeatedly to expose, and throughput thereof is improved.

BRIEF DESCRIPTION OF THE DRAWINGS

FIG. 1 is a sectional view showing an example of an electron beam lithography apparatus of the present invention.

FIG. 2 is a block diagram showing the function of the proximity effect correction part shown in FIG. 1.

FIG. 3 is a flow chart showing steps for an exposure map implementation.

FIG. 4 is an illustration to show an example of a configuration of a pattern.

FIG. 5 is a block diagram showing an exposure map implementation means further in detail.

FIG. 6 is a time chart to show an exposure map implementation clock time and a lithography time.

FIG. 7 is another time chart to show an exposure map implementation clock time and a lithography time.

FIG. 8 is a block diagram showing a function of the proximity effect correction part shown in FIG. 1.

FIG. 9 is another block diagram showing another function of the proximity effect correction part shown in FIG. 1.

FIG. 10 is a block diagram showing a function of the electron beam lithography apparatus in the prior art.

DETAILED DESCRIPTION OF THE PREFERRED EMBODIMENTS

Referring to the figures, embodiments of the present invention will be explained as follows.

In the beginning, a construction of an example of an electron beam lithography apparatus according to the present invention will be explained using FIG. 1.

In FIG. 1, a part which is shown on the right hand side with hatching, is an electron beam generating equipment body 100 to expose a wafer.

A sample 108 is transferred from a transportation part 102 to a sample bed plate 101 inside of the electron beam generating equipment body 100.

An electron beam 104 that is emitted from an electron gun 103 provided on top of the electron beam generating equipment body 100 is adjusted in its configuration by an optical lens 106 provided in the equipment body 100, and is deflected furthermore by a deflection device 107 constructed with an electromagnetic deflection device and an electrostatic deflection device, and is irradiated on an objective position of the sample 108 disposed on the sample bed plate 101.

A plurality of cross-sections of the irradiated electron beam 104 are capable of being copied on the sample 108 by selecting an aperture 105.

A part of right-hand side of FIG. 1 shows the function of the control system with plural blocks, which controls all of the system and functions as an interface with an external device.

A computer 112 transmits the lithography data of the patterns that should be exposed and which are stored in a hard disk 121.

Black boxes surrounded by a dash-double dot line 111 are a control system digital processing group which converts the lithography data transmitted from the computer 112 into deflection data for the electron beam continuously at a high speed, and are connected to other controllers through a bus 119. Data are processed as follows.

(1) Pattern data dividing part 123:

Compressed lithography data transmitted from the computer 112 are stored.

(2) Pattern reload part 124:

The compressed lithography data re reconstructed to the pattern data.

(3) Pattern decomposition part 125:

Each figure being reconstructed is replaced as a shot which has a configuration that can be exposed by the electron beam, and data of position, configuration, and the exposure amount of each shot are provided.

(4) Matching correction part 126:

By watching position difference and deformation between the electron beam irradiation position and the sample 108 with a sensor 109, they are revised according to the position difference and the deformation.

(5) Proximity effect correction part 127:

A processing to revise the proximity effect is performed. The exposure map 129 of an exposure quantity to a unit area of the pattern to be exposed is previously obtained, and is stored in a storage device, and the exposure quantity is revised in a shot unit referring to the value of the exposure map.

(6) Follow-up absolute calibration part 128:

In order to obtain a continuous writing, the electron beam deflection position is calculated based on a position of the sample bed plate 101 measured with a length measuring machine 110 and a sample bed plate position measuring part 120 so that the electron beam 104 will be irradiated onto the objective position on the sample 108, and quantities of the deflection distortion of the electron beam generating equipment body 100 are revised too.

(7) Step controller 122:

In order to operate the processing in each unit above smoothly, monitoring and controlling are performed. Data from the unit in the above-mentioned frame 111 undergo a D-A conversion in a digital-to-analog converter 113, and are transferred to the beam controller 114 so as to control the optical lens 106 and the deflection device 107.

Furthermore, a high voltage power supply 115 provides an accelerating voltage to the electron gun 103, an aperture controller 116 controls an aperture replacement part 131 so as to select configurations of an aperture 105, a sample bed plate controller 117 controls movement of the sample bed plate 101, and a transportation system controller 118 controls a transportation part 102 which transports the sample 108 to the sample bed plate 101.

The units are connected with each other via a bus 119, and the signals are transferred through an interface.

These units can be controlled by the computer 112 too. The first embodiment of the present invention is shown by FIGS. 2 to 7.

FIG. 2 is a block diagram showing the function of a proximity effect correction part 127 shown in FIG. 1.

This electron beam lithography apparatus has a plurality of lithography data generation part $12a$, $12b$, ..., $12n$ controlled by a lithography data generation part control means 11 and an electron beam lithography means 16.

Each respective lithography data generation part $12a$, $12b$, ..., $12n$ respectively has lithography data generation means $13a$, $13b$, ..., $13n$, electron beam correction means $14a$, $14b$, ..., $14n$, and exposure map implementation means 15a, 15b, ..., 15n. The lithography data generation part control means 11 indicates the condition of the lithography data to the plural lithography data generation parts 12a, 12b, ..., 12n, or outputs a select indication of the data to be output from the lithography data generation part to the electron beam lithography means 16.

A flow chart which shows steps for implementing the exposure map is shown in FIG. 3 and an example of pattern configuration is shown in FIG. 4

In step S41 of FIG. 3, patterns 51 shown in FIG. 4 are divided with a mesh size 52, and the pattern area density in each mesh is obtained in step S42.

In the next step S43, smoothing for reducing dimensional change at a part where the area density changes greatly between the adjacency meshes, is performed, and an exposure map is formed in step S44.

In case of implementation of the exposure map, electron beam data (for example, coordinates, size, irradiation quantity) from the lithography data generation means 13 are transferred to the exposure map implementation means 15.

FIG. 5 is a block diagram which shows the exposure map implementation means 15 further in detail.

In the exposure map implementation means 15, in order to make and store the exposure map obtained from the lithography data that the lithography data generation means 13 shown in FIG. 2 has generated, on an exposure map storage device 61, coordinates are provided as inputs to a coordinates-address translation means 62 to generate a corresponding address from the coordinate data, and an area density meter calculating means 63 to generate an area density from data to show a size of the pattern are obtained, the value obtained as the above is smoothed by the area density smoothing means 64, and the smoothed value is accumulated by the exposure map storage device 61 so as to be stored.

Moreover, when the value stored in the exposure map storage device 61 is smoothed again, the value is read out from the exposure map storage device 61, and is smoothed with the area density smoothing means 64 and is stored in the exposure map storage device 61.

When exposing, the electron beam correction means 14 revises an irradiation quantity data among the lithography data input from the lithography data generation means 13 based on the value of the address corresponding to the exposure map generated previously.

That is, the value that corresponding lithography data and several values close thereto are read out from the value of the exposure map storage device 61 which is generated by the exposure map implementation means 15, and calculates a density degree in a peripheral of the lithography data from them, and the irradiation quantity is adjusted in inversely proportional to it.

The electron beam lithography means 16 outputs irradiation quantity, coordinates and size of the electron beam revised by the electron beam correction means 14 to an electron gun and lithography correction is performed.

Next in FIG. 2, the lithography data generation part control means 11 outputs different dividing mesh sizes and the condition of smoothing number of times, respectively to each lithography data generation part 12a, 12b, ..., 12n. In each lithography data generation part 12a, 12b, ..., 12n, area densities are calculated according to mesh sizes, by an area density calculating means 63 shown in FIG. 5, in each of the exposure map implementation means 15a, 15b, ..., 15n on the basis of the lithography data generated by each lithography data generation means 13a, 13b, ..., 13n, and the calculated value is addressed to the storage device address which is output from the coordinates—address translation means 62 and is stored in the exposure map storage device 61.

By processing in this way, a plurality of the exposure maps having different conditions becomes possible to be formed within a clock time the same as the exposure map implementation time as before.

When one of the lithography data generation parts 12a, 12b, ..., 12n is selected by the lithography data generation part control means 11, and the lithography data is then output from the lithography data generation means 13 in the selected lithography data generation part 12n.

In the same way as the exposure map generation stated above, the address corresponding to the exposure map storage device 61 shown in FIG. 4 is output from the coordinates—address translation means 62, and the corresponding value and values close thereto are read.

In electron beam correction means 14, referring to the value having been read, the irradiation quantity is revised so as to make the irradiation quantity relatively small in the place where the exposure density is high and to make the irradiation quantity relatively large on the contrary in the place where the exposure density is low.

The electron beam lithography means 16 performs lithography correction by receiving the lithography data revised by the electron beam correction means 14.

This operation is continuously performed relating to all lithography data of the lithography data generation part 12a, 12b, ..., 12n, and the lithography results are evaluated. Thereby the lithography work becomes possible to be done again on the basis of the most suitable evaluated lithography data.

FIG. 6 is a time chart to show the size of the exposure map implementation time and the lithography time, and the first embodiment of the present invention is shown by comparing with a case of the prior art.

In FIG. 6, the lithography data under three different conditions (condition 1, condition 2 and condition 3) are evaluated, and time rates in a case exposed with the evaluated suitable data (lithography data of condition 2 in the case of FIG. 6) are compared.

In the case of the prior art, the exposure map is made under the condition 1, an empty lithography is performed based on the exposure map, the exposure map is formed under the condition 2 next so as to perform the empty lithography, and after that the exposure map is formed under the condition 3 so as to perform empty lithography.

Then, results of the empty lithographs done under each condition are evaluated, and if it becomes clear that the condition 2 is the most suitable, the exposure map is formed again and a real lithography is performed under the condition 2.

On the other hand, in the first embodiment of the present invention, the exposure maps under the different conditions are formed simultaneously.

That is, the exposure map under the condition 1 is formed by the lithography data generation part 12a, the exposure map under the condition 2 is formed by the lithography data generation part 12b, and the exposure map under the condition 3 is formed by the lithography data generation part 12c, respectively in parallel.

The formed exposure maps are stored in each lithography data generation part.

In the electron beam lithography means 16, the lithography under the condition 1, condition 2, and condition 3 are performed successively based on the exposure maps stored in each lithography data generation part 12a, 12b, 12c.

If it becomes clear that the condition 2 is the most suitable as a result of having evaluated the lithography results, the lithography under the condition 2 can be performed promptly using the exposure map stored in the lithography data generation part 12b.

Therefore, the throughput of the lithography can be improved largely comparing with that in the prior art. FIG. 7 is another embodiment of the time chart shown in FIG. 6. In the plural lithography data generation parts 12a, 12b, . . . , 12n shown in FIG. 2, this example shows lithography data to expose different patterns.

As shown in FIG. 7, the lithography data generation part control means 11 shown in FIG. 2, controls the five lithography data generation parts 12a, 12b, 12c, 12d, 12e so as to form different lithography data with each of the lithography data generation means 13.

In the five lithography data generation parts 12a, 12b, 12c, 12d, 12e, the exposure maps are formed based on the lithography data output from each lithography data generation means 13.

As a result, as shown in the figures, it becomes possible in the present invention to expose six patterns A, B, C, D, E, F within the same time as that spent for a lithography of two patterns A, B in the prior art.

While the patterns A to F exposes so as to be corrected, as exposure maps of patterns G to J can be formed in the lithography data generation part 12b to 12e furthermore. After finishing the correction lithography of the pattern F, the correction lithography of the pattern G becomes possible successively.

As stated above, plural exposure maps of different types becomes possible to be formed with the same times as the implementation times of one exposure map in the prior art.

Therefore, the electron beam lithography to be performed next, becomes possible to be performed successively in spite of the different lithography data in the exposure map unit.

Furthermore, while performing electron beam lithography, in the lithography data generation part which is not used, it becomes possible to perform the implementation of the exposure map using new lithography data in parallel, throughput of the lithography is improved largely.

Moreover, in the electron beam lithography apparatus shown in FIG. 2, an exposure map exceeding a range that can be formed with the lithography data generation part in one system, can be formed easily, too.

That is, when exceeding the range that the exposure map as the lithography object can be formed with the lithography data generation part of the one system, the exposure map implementation is performed by dividing the total exposure map with the exposure map unit that can be processed with the lithography data generation part of the one system.

At first, the lithography data generation part control means 11 orders how to divide the total exposure map, the exposure maps are formed respectively in a divided unit with each of the lithography data generation parts 12a, 12b, . . . , 12n.

Referring to the exposure map formed with the lithography data generation part 12a next, the electron beam lithography means 16 performs exposure, successively referring to the exposure map formed with the lithography data generation part 12b, the electron beam lithography means 16 exposes in the same way, and as each of the lithography data generation parts 12a to 12n are controlled with the lithography data generation part control means 11, an exposure map of all sizes become possible to be exposed.

FIG. 8 shows the second embodiment of the present invention and is a block diagram corresponding to FIG. 2.

It is a characteristic that this embodiment comprises two lithography data generation parts 12a, 12b and an output comparing means 81.

The output comparing means 81 compares the output of the electron beam correction means 14a in the lithography data generation part 12a with the output of the electron beam correction means 14b in the lithography data generation part 12b.

In FIG. 8, the lithography data generation part control means 11 orders the same operation to two systems of the lithography data generation part 12a and the lithography data generation part 12b at first, and the outputs therefrom are compared with the output comparing means 81.

When the output of the electron beam correction means 14b did not accord with the output of the electron beam correction means 14a, the information relating to the comparing is transmitted to the lithography data generation part controller 11, the lithography data generation part control means 11 starts each of the lithography data generation parts 12a, 12b again, and the outputs of them are compared with the output comparing means 81.

If the outputs accord each other as a result of the comparing, it is judged as being normal, and the exposing is performed, thereby, a lithography failure can be prevented beforehand and reliability of the apparatus and system is improved largely.

FIG. 9 shows a third embodiment of the present invention and is a block diagram corresponding to FIG. 2.

In this embodiment, a first electron beam lithography apparatus 91 having a construction the same as that shown in FIG. 8, and the second electron beam lithography apparatus 92a installing only electron beam lithography means 16a referring to the construction shown in FIG. 8 and other electron beam lithography apparatus 92n installing only electron beam lithography means 16n in the same way are combined through a communications means 93.

In the first electron beam lithography apparatus 91, in the case that the result obtained by comparing the output from the output comparing means 81 is normal, a data save means 94 saves the output from the lithography data generation part 12a or the lithography data generation part 12b.

In the electron beam lithography apparatus 91, the lithography data generation part control means 11 controls the two systems of the lithography data generation part 12a and the lithography data generation part 12b to do the same operation, and the outputs of the both parts are compared with the output comparing means 81.

In the case that the result by comparing the output from the output comparing means 81 is normal, the lighography data generation part control means 11 indicates to the lithography data generation part 12a to expose, and indicates to the lithography data generation part 12b to transmit the output into the data save means 94 simultaneously.

The output of the electron beam lithography data generation part 12b is saved in the data save means 94.

This saved data is transmitted to the second electron beam lithography apparatus 92a or the electron beam lithography apparatus 92n through a communications means 93. Thereby the lithography processing which is performed in the same way as the first electron beam lithography apparatus performed by the plural electron beam lithography apparatuses becomes possible.

As stated above according to the present invention, the evaluation of the most suitable lithography data can be performed quickly, and the throughput is improved.

Moreover, as the data of the exposure map can be saved, and the work to form the same data in the case of exposing again can be omitted, it becomes possible to improve the throughput.

Moreover, reliability of the apparatus and the system are possible to be improved.

What is claimed is:

1. An electron beam lithography apparatus comprising:

a plurality of lithography data generation parts, respectively forming a plurality of exposure maps having different exposure conditions and generating lithography data to form an exposure pattern for a sample, said lithography data generation parts each having:

an exposure map implementation part to form an exposure map for an electron beam from said lithography data, an electron beam correction part for correcting an irradiation quantity of said electron beam to be irradiated to said sample referring to said exposure map, and an electron beam lithography part for performing exposure by irradiating said electron beam onto the sample based on a value corrected by said electron beam correction part, wherein said lithography data generation parts simultaneously and respectively form said exposure maps respectively having different exposure conditions based on an order that orders a plurality of different operations based on one of the plurality of lithography data to plural lithography data generating parts, and said electron beam lithography part irradiate said electron beam based on one of said exposure maps corrected by said electron beam correction parts.

2. An electron beam lithography apparatus as defined in claim 1, wherein said plurality of lithography data generation parts form plurality of lithography data having a different condition to be generated in parallel.

3. An electron beam lithography apparatus as defined in claim 1, comprising an output comparing part for comparing outputs from said several lithography data generation parts.

4. An electron beam lithography apparatus as defined in claim 1, wherein an exposure map implementation of a second pattern is performed in parallel based on said lithography data from a second lithography data generation part in plurality of said lithography data generation parts, while a first pattern is exposed based on said lithography data from a first lithography data generation part in plurality of said lithography data generation parts.

5. An electron beam lithography apparatus as defined in claim 1 wherein, said exposure map is divided by said plurality of lithography data generation part.

6. An electron beam lithography apparatus as defined in claim 1, wherein said sample is at least one of a wafer, a mask, and a reticle.

7. An electron beam lithography apparatus, comprising a first electron beam lithography apparatus and a second electron beam lithography apparatus connected to a data transmission part, wherein said first electron beam lithography apparatus forms a plurality of sets of lithography data based on an order that orders a plurality of different operations based on one of the plurality of lithography data to plural lithography data generating parts, and said second electron beam lithography apparatus exposes a sample based on lithography data formed by said first electron beam lithography apparatus.

8. An electron beam lithography apparatus as defined in claim 7, wherein said first electron beam lithography apparatus comprises plurality of lithography data generation parts having a lithography data generation part for forming said lithography data, an exposure map implementation part for forming exposure maps of an electron beam using said lithography data, and an electron beam correction part for correcting an irradiation quantity of the electron beam to be irradiated to the sample referring to said exposure map, and said second electron beam lithography apparatus comprises an electron beam lithography part for exposing said sample by irradiating said electron beam on said sample based on a value corrected by said electron beam correction part of the first electron beam lithography apparatus.

9. A lithography method comprising the steps of:

forming plurality of sets of lithography data to form an exposure pattern on a sample, forming respective exposure maps having different exposure conditions from said plurality of sets of lithography data, correcting an irradiation quantity of an electron beam to be irradiated on said sample by referring to said exposure maps, simultaneously and respectively forming said exposure maps respectively having different exposure conditions based on a order that orders a plurality of different operations based on one of the plural lithography data for forming plural sets of lithography data, and irradiating said sample with said electron beam on the basis of one of said exposure maps with said irradiation quantity corrected.

10. A lithography method comprising the steps of forming a first electron beam lithography apparatus for forming a plurality of sets of lithography data based on a order that orders a plurality of different operations based on one of the plural lithography data for forming plural sets of lithography data, and irradiating an electron beam on a sample using a second electron beam lithography apparatus based on one of said sets of lithography data formed by said first electron beam lithography apparatus.

* * * * *